United States Patent
Boateng

(10) Patent No.: US 7,260,793 B2
(45) Date of Patent: Aug. 21, 2007

(54) APPARATUS AND METHOD FOR TEST-STIMULI COMPACTION

(75) Inventor: Kwame Osei Boateng, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 868 days.

(21) Appl. No.: 09/985,768

(22) Filed: Nov. 6, 2001

(65) Prior Publication Data

US 2002/0184587 A1    Dec. 5, 2002

(30) Foreign Application Priority Data

Jun. 5, 2001    (JP) .............................. 2001-168951

(51) Int. Cl.
G06F 15/70    (2006.01)
(52) U.S. Cl. .......................... 716/4; 714/738
(58) Field of Classification Search ................ 716/4–6; 714/25, 31, 32, 703, 706, 715, 738, 739; 324/500, 512
See application file for complete search history.

(56) References Cited

U.S. PATENT DOCUMENTS

| | | | |
|---|---|---|---|
| 5,726,996 A | | 3/1998 | Chakradhar et al. |
| 5,771,243 A * | | 6/1998 | Lee et al. ................... 714/738 |
| 5,987,636 A | | 11/1999 | Bommu et al. |
| 6,212,667 B1 | | 4/2001 | Geer et al. |
| 6,782,501 B2 * | | 8/2004 | Distler et al. ............... 714/738 |
| 6,810,372 B1 * | | 10/2004 | Unnikrishnan et al. ....... 703/13 |
| 2002/0099991 A1 * | | 7/2002 | Distler et al. ............... 714/738 |

FOREIGN PATENT DOCUMENTS

| | | |
|---|---|---|
| DE | 195 30 095 | 2/1997 |
| DE | 199 24 242 | 12/1999 |
| JP | 2000-214236 | 8/2000 |

OTHER PUBLICATIONS

Kajihara et al., "Cost-Effective Generation of Minimal Test Sets for Stuck-at Faults in Combinational Logic Circuits," IEEE, Dec. 1995, pp. 1496-1504.*
Guo et al., "On Improving Static Test Compaction of Sequential Circuits," IEEE, Jan. 3-7, 2001, pp. 111-116.*
Pomeranz et al, "Static Test Compaction for Synchronous Sequential Cirenits Based on Vector Restoration," IEEE, Jul. 1999, pp. 1040-1049.*
Pomeranz et al., "Vector Replacement to Improve Static-Test Compaction for Synchronous Sequential Cirenits," IEEE, Feb. 2001, pp. 336-342.*
Pomeranz et al., "Verse: A Vector Replacement Procedure for Improving Test Compaction in Synchronous Sequential Circuits," IEEE, Jan. 7-10, 1999, pp. 1-6.*

(Continued)

Primary Examiner—Vuthe Siek
(74) Attorney, Agent, or Firm—Staas & Halsey LLP

(57) ABSTRACT

Based on the concept of minimization, a method of static compaction has been developed for a digital circuit. The compaction method is a combination of two main procedures: one for the selection of essential test stimuli and the other for the elimination of redundant test stimuli, and effective in minimizing any set of test stimuli without modifying any of the test stimuli.

14 Claims, 17 Drawing Sheets

OTHER PUBLICATIONS

Higami et al., "Test Sequence Compaction for Sequential Circuits With Reset States," IEEE, Dec. 4-6, 2000, pp. 165-170.*
Pomeranz et al., "An Approach for Improving the Levels of Compaction Achieved by Vector Omission," IEEE, Nov. 7-11, 1999, pp. 463-466.*
Guo et al., "On Speeeding-Up Vector Restoration Based Static Compaction of Test Sequences fro Sequential Circuits," IEEE, Dec. 1998, pp. 467-471.*
Hsiao et al., "Fast Static Compaction Algorithms for Sequential Circuit Test Vectors," IEEE, Mar. 1999, pp. 311-322.*
Elizabeth et al., "Efficient Techniques for Dynamic Test Sequence Compaction," IEEE, Mar. 1999, pp. 323-330.*
Pomeranz et al., "On Static Compaction of Test Sequences for Synchronous Sequential Circuits," ACM, 1996, pp. 1-6.*
Hamzaoglu et al., "Test Set Compaction Algorithms for Combinational Circuits*," ACM 1998, pp. 283-289.*
Office Action for corresponding German Application No. 102 00833.7 dated Apr. 28, 2005.
K. O. Boateng, H. Takahashi and Y. Yakamatsu, "Diagnosing Delay Faults in Combinational Circuits Under the Ambiguous Delay Model," IEICE Transaction on Information and Systems, vol. E82-D, No. 12, pp. 1563-1571, Dec. 1999.
K. O. Boateng, H. Takahashi, and Y. Takamatsu, "Multiple Gate Delay Fault Diagnosis Using Test-Pairs for Marginal Delays," IEIEC Transaction on Information and Systems, vol. E81-D, No. 7, pp. 706-715, Jul. 1998.
N. Yanagida, H. Takahashi and Y. Takamatsu, "Multiple Fault Diagnosis By Sensitizing Input Pairs," IEEE Design and Test of Computers, vol. 12, No. 3, pp. 44-52, no date.
I. Pomeranz and S. M. Reddy, "On Test Compaction Objectives for Combinational and Sequential Circuits," Proceedings of IEEE International Conference on VLSI Design, pp. 279-284, 1997.
S. Kajihara and K. Saluja, "On Test Pattern Compaction Using Random Pattern Fault Simulation," Proceedings of IEEE International Conference on VLSI Design, pp. 464-469, 1997.
I. Hamzaoglu and J. H. Patel, "Test Set Compaction Algorithms for Combinational Circuits," Proceedings of ACM International Conference on CAD, pp. 283-289, 1995.
M. S. Hsiao and S. T. Chakradhar, "Partitioning and Reordering Techniques for Static Test Sequence Compaction of Sequential Circuits," Proceedings of the 7th IEEE Asian Test Symposium, pp. 452-457, 1998.
M. S. Hsiao and S. T. Chakradhar, "State Relaxation Based Subsequence Removal for Fast Static Compaction in Sequential Circuits," Proceedings of Design, Automation, and Test in Europe Conf., pp. 557-582, 1998.
M. S. Hsiao and E. M. Rudnick and J. H. Patel, "Fast Algorithms For Static Compaction of Sequential Circuit Test Vectors," Proceedings of IEEE VLSI Test Symposium, pp. 188-195, 1997.

* cited by examiner

| Test\Fault Vector | $f_1$ | $f_2$ | $f_3$ | $f_4$ | $f_5$ | $f_6$ | $f_7$ | $f_8$ | $f_9$ | $f_{10}$ | $f_{11}$ | $f_{12}$ |
|---|---|---|---|---|---|---|---|---|---|---|---|---|
| $t_1$ | × | × |   | × |   |   | × |   |   |   |   |   |
| $t_2$ | × |   | × | × |   |   |   |   |   | × |   |   |
| $t_3$ |   | × |   |   | × |   | × |   |   |   | × |   |
| $t_4$ |   |   | × |   |   | × |   |   |   |   |   |   |
| $t_5$ |   |   |   |   | × |   |   |   |   | × |   |   |
| $t_6$ |   |   |   | × |   |   | × | × |   |   | × |   |
| $t_7$ |   |   |   |   |   |   | × | × |   |   |   | × |

F I G. 2

| Test Vector \ Fault | $f_1$ | $f_3$ |
|---|---|---|
| $t_1$ | X | |
| $t_2$ | X | X |
| $t_4$ | | X |

FIG. 3

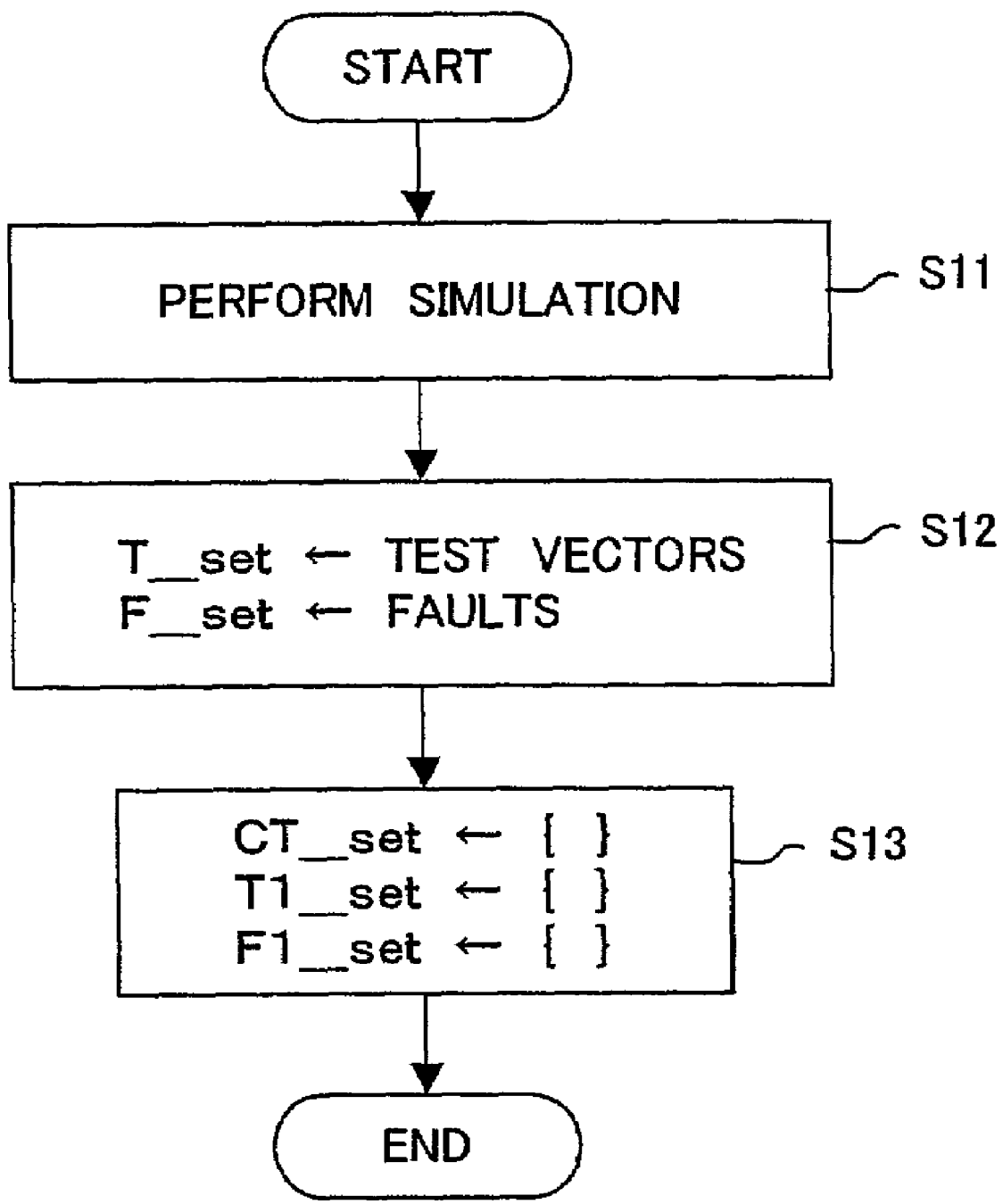
F I G. 5

| Test Vector | Pattern |
|---|---|
| $t_1$ | 0 1 2 2 1 |
| $t_2$ | 1 1 2 2 1 |
| $t_3$ | 2 0 2 0 1 |
| $t_4$ | 2 1 2 0 1 |
| $t_5$ | 1 0 0 1 1 |
| $t_6$ | 1 0 1 1 1 |
| $t_7$ | 2 0 2 1 1 |
| $t_8$ | 2 1 2 2 0 |
| $t_9$ | 2 1 2 2 1 |
| $t_{10}$ | 1 0 0 1 0 |
| $t_{11}$ | 1 1 0 1 1 |
| $t_{12}$ | 0 0 1 1 1 |
| $t_{13}$ | 0 1 1 1 1 |
| $t_{14}$ | 1 1 0 2 1 |
| $t_{15}$ | 1 1 1 2 1 |
| $t_{16}$ | 0 1 0 2 0 |

F I G. 1 2

| Fault | Counter | Test Vector | #Fault |
|---|---|---|---|
| 1/1 | 3 | $t_1$ | 6 |
| 5/1 | 3 | $t_2$ | 0 |
| 6/1 | 3 | $t_7$ | 0 |
| 8/0 | 2 | $t_8$ | 2 |
| 12/1 | 2 | $t_9$ | 0 |
| 13/1 | 3 | $t_{10}$ | 2 |
| 16/1 | 3 | $t_{11}$ | 4 |
| 20/1 | 2 | $t_{12}$ | 3 |
| 26/1 | 2 | $t_{13}$ | 6 |
| 33/1 | 2 | $t_{14}$ | 4 |
| 34/1 | 2 | $t_{16}$ | 2 |
| 36/1 | 2 | | |

FIG. 13

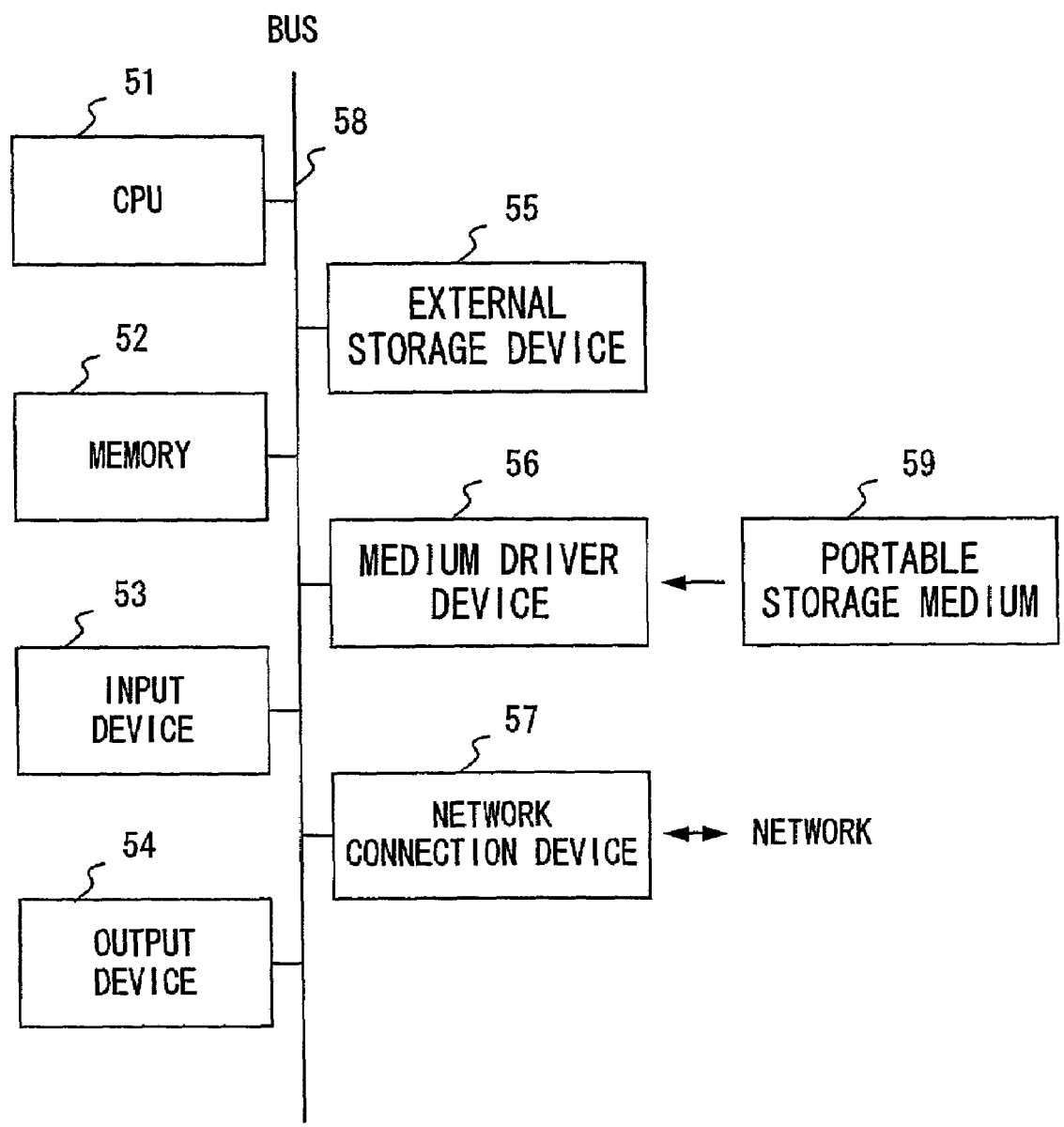
F I G. 16

APPARATUS AND METHOD FOR TEST-STIMULI COMPACTION

BACKGROUND OF THE INVENTION

1. Field of the Invention

The present invention relates generally to the testing of digital circuits and more particularly to an apparatus for compaction of test stimuli and a method thereof.

2. Description of the Related Art

In order to ensure the production of reliable digital/computer systems, test stimuli are generated to test the systems. For a digital circuit, a test stimulus may be a single input pattern or a sequence of input patterns that comprises an initializing subsequence, a sensitizing subsequence and a propagation subsequence. In some cases the sensitizing subsequence is the same as the propagation subsequence. Hereafter the term "test vector" will also be used to represent a general test stimulus for a digital circuit and the term "test set" will be used to represent a set of test vectors.

An important objective of test generation is to achieve significant fault coverage with the generated test vectors for the circuit under test. The generation algorithms are such that, by of necessity concentrating on fault coverage, they generate sets of test vectors with redundancies. These redundancies are not easy to detect and result in a large set of test vectors.

The cost of applying the large set of test vectors is high since the cost of test equipment is related to its memory capacity. Thus, the number of test vectors impacts on the cost of testing which is indispensable in the production and maintenance of reliable digital/computer systems. Memory capacity is one of the main factors that determine the cost of test equipment. Large memory means high cost. If available test equipment does not have enough memory capacity for loading all the test vectors, then there is the need to load the test equipment more than once during test application to the circuit under test. More test vectors than can be contained in the memory of the test equipment calls for memory update (reloading of a subset of the test vectors) during test application. Re-loading of the test equipment during testing significantly prolongs the test application time (TAT). Even a single memory update leads to a big leap in the test application time. The long test application time impacts the time-to-market of the manufactured IC (integrated circuit) products.

It is evident, from the foregoing, that small test sets are desirable to reduce test cost and shorten the time-to-market of the reliable systems. Thus, there is the need to maintain a small number of test vectors. Reducing the number of the test vectors without compromising fault coverage is called test compaction. Test compaction algorithms should find ways of achieving small test sets without diminishing fault coverage. In other words, the algorithms should keep numbers of test vectors low while maintaining as high fault coverage as possible.

Two types of compaction techniques exist—dynamic and static compaction. Dynamic techniques attempt to reduce the number of test vectors while they are being generated. Often dynamic compaction requires the modification of the test generator. Static techniques, on the other hand, seek to reduce the number of the already generated test vectors. Thus static compaction is a post-processing step to test generation. Static techniques are therefore independent of the test generation algorithms and do not require any modifications of the algorithms. Moreover, even if dynamic compaction is used during test generation, static compaction can further reduce the size of the generated test set. This suggests that static compaction is more effective in reducing the sizes of test sets and hence the subsequent cost of testing.

Hsiao et al. have reported on their work on methods of test sequence compaction for sequential circuits in the following documents.

(1) M. S. Hsiao and S. T. Chakradhar, "Partitioning and reordering techniques for static test sequence compaction of sequential circuits," Proc. of the 7th IEEE Asian Test Symposium, pp.452-457, 1998.

(2) M. S. Hsiao and S. T. Chakradhar, "State relaxation based subsequence removal for fast static compaction in sequential circuits," Proc. of Design, Automation, and Test in Europe Conf., pp.577-582, 1998.

(3) M. S. Hsiao, E. M. Rudnick and J. H. Patel, "Fast algorithms for static compaction of sequential circuit test vectors," Proc. of IEEE VLSI Test Symposium, pp.188-195, 1997.

Their methods seek to shorten the sequences. Pomeranz et al. have proposed a method of efficient storage of test responses in the following document.

(4) I. Pomeranz and S. M. Reddy, "On test compaction objectives for combinational and sequential circuits," Proc. of IEEE International Conference on VLSI Design, pp.279-284, 1998.

Kajihara et al. and Hamzaoglu et al., have reported on their work on test pattern compaction for combinational circuits in the following documents.

(5) S. Kajihara and K. Saluja, "On test pattern compaction using random pattern fault simulation," Proc. Of IEEE International Conference on VLSI Design, pp.464-469, 1998.

(6) I. Hamzaoglu and J. H. Patel, "Test set compaction algorithms for combinational circuits," Proc. of ACM International Conference on CAD, pp.283-289, 1997.

They have developed methods of static compaction that are tailor-made to work together with previously proposed methods of generating compact tests.

Digital systems employ both sequential and combinational circuits. Also, different test packages employ different test generation algorithms. Therefore, for a general digital circuit, there is the need for a general method of static test compaction the effectiveness of which is completely independent of any test generation algorithm.

SUMMARY OF THE INVENTION

It is an object of the present invention to provide an apparatus for test-stimuli compaction applicable to the testing of a general digital circuit and a method thereof.

The compaction apparatus according to the present invention includes a selection device, an elimination device and an output device and performs compaction of a set of test stimuli for a digital circuit.

The selection device selects essential test stimuli from among subsets of the set of test stimuli. A fault in the digital circuit detectable by an essential test stimulus is detectable by no other test stimulus in a given subset of test stimuli. The elimination device eliminates redundant test stimuli from subsets of test stimuli after the selection of essential test stimuli from each subset. The output device outputs a compacted set comprising the selected essential test stimuli. Each subset sent to the selection device is the superset of the next subset to be sent to the selection device.

BRIEF DESCRIPTION OF THE DRAWINGS

FIG. 2 shows a cover table of a test set;

FIG. 3 shows a partial cover table of the test set;

FIG. 5 shows a flowchart of a process in the first phase;

FIG. 12 shows a test set for the digital circuit;

FIG. 13 shows a summary of the partial cover table;

FIG. 16 shows the configuration of an information processing apparatus; and

DESCRIPTION OF THE PREFERRED EMBODIMENTS

The embodiments of the present invention are described below in detail by referring to the attached drawings.

Figure 1:
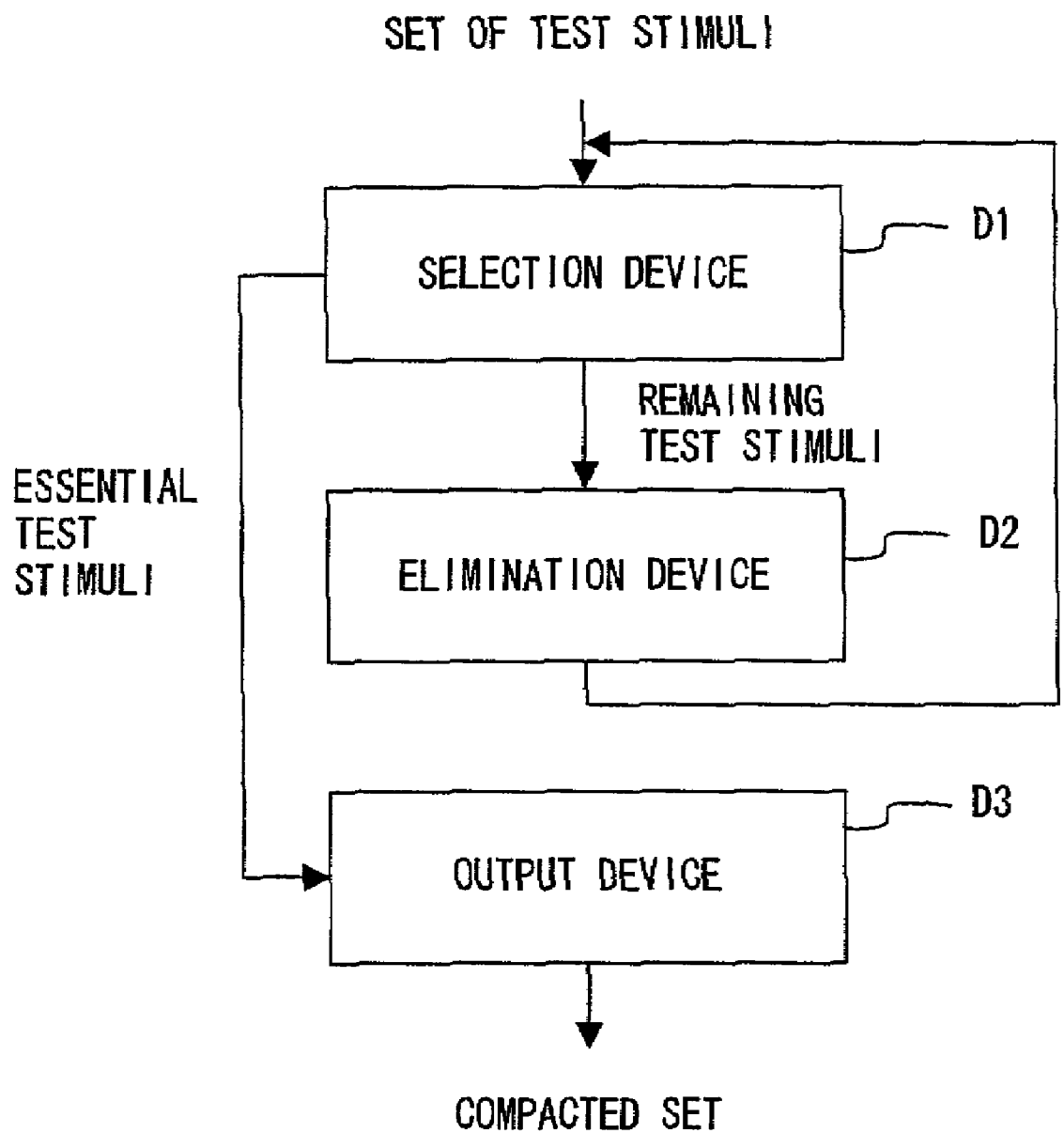
FIG. 1 shows the principle of a test-stimuli compaction apparatus according to the present invention.

FIG. 1 shows the principle of a test-stimuli compaction apparatus according to the present invention. The compaction apparatus includes a selection device D1, an elimination device D2 and an output device D3 and performs compaction of a set of test stimuli for a digital circuit.

The selection device D1 selects essential test stimuli from among subsets of the set of test stimuli. A fault in the digital circuit detectable by an essential test stimulus is detectable by no other test stimulus in a given subset of test stimuli. The elimination device D2 eliminates redundant test stimuli from subsets of test stimuli after the selection of essential test stimuli from each subset. The output device D3 outputs a compacted set comprising the selected essential test stimuli.

When the set of test stimuli (or the subset of test stimuli from the elimination device D2) are given, the selection device D1 selects the currently identifiable set of essential test stimuli from among the given test stimuli and passes them to the output device D3 and the remaining test stimuli to the elimination device D2. The elimination device D2 eliminates the currently identifiable set of redundant test stimuli included in the subset of test stimuli received from the selection device D1 and passes remaining test stimuli back to the selection device D1. This procedure continues till no test stimuli remain. Then, the output device D3 outputs the essential test stimuli received from the selection device D1 as the compacted set of test stimuli.

According to such a compaction apparatus, various hierarchy of essential test stimuli, that are indispensable for the detection of all the faults detectable by the original test set, are extracted from the given test set. Since this compaction method is completely independent of the test generation algorithm, it is effective in performing static compactions of test stimuli generated by any generation algorithm.

The selection device D1 and elimination device D2 in FIG. 1 correspond to, for example, a combination of the CPU (central processing unit) 51 and the memory 52 shown in FIG. 16, which is described later. The output device D3 in FIG. 1 corresponds to, for example, the combination of the CPU 51 and memory 52, the output device 54, or the network connection device 57 shown in FIG. 16. The essential test stimuli correspond to the essential test vectors described below.

In the following embodiments, the task of the static compaction of a set of test stimuli (test vectors) is formulated as a minimum covering problem. As matter of fact, the compaction apparatus finds the minimum subset of the original test set that can detect (cover) all the faults detectable in the target circuit by the original test set without modifying any of the test vectors. The method used by the compaction apparatus is an intelligent combination of two main procedures: one for the selection of essential test vectors and the other for the elimination of redundant test vectors.

The compaction apparatus uses a data structure that makes it possible to avoid memory-consuming matrices associated with the concept of minimum covering, thereby ensuring efficient run-time. To ensure that the solution of the minimization problem is the minimal test set, a sort algorithm is employed in the elimination of redundant test vectors. The Basic Concept of the static compaction is as follows.

Definition 1: The set of all faults, $F_{set}$, detectable in circuit, C, by a set, $T_{set}$, of test vectors forms the cover of $T_{set}$. A table showing the coverage of $F_{set}$ by $T_{set}$ is called the cover table of $T_{set}$.

Definition 2: Let the fault f in circuit C be detectable by a test vector $t_{ep}$ of a test set $T_{set}$. If no other test vector of $T_{set}$ detects f, then $t_{ep}$ is an essential vector of $T_{set}$, and the fault f is an essential fault of C with respect to $T_{set}$.

The minimum covering concept is a well-known algorithm that is often used in logic optimization. The algorithm has one shortcoming in that it requires large memory space.

Figure 3:
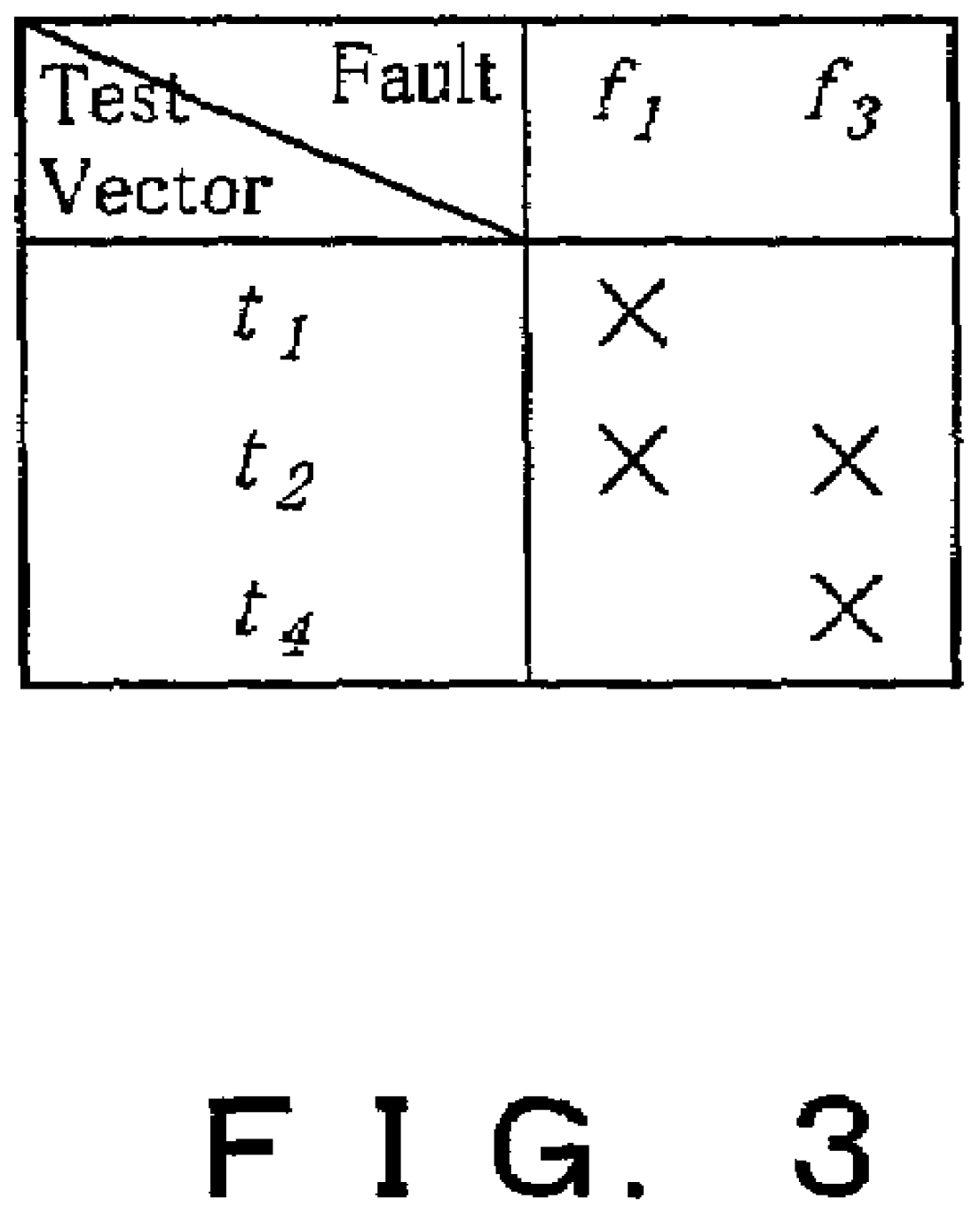

Consider that the set $T=\{t_1, t_2, t_3, t_4, t_5, t_6, t_7\}$ of test vectors covers all the stuck-at faults on lines $L_1, L_2, L_3, L_4, L_5, L_6$ which form part of a circuit, C. Let the corresponding fault set be $F=\{f_1, f_2, f_3, f_4, \ldots, f_{11}, f_{12}\}$ and the cover table of T be as shown in FIG. 2. In this cover table, a symbol "x" in the intersection of row $t_i$ and column $f_j$ indicates that vector $t_i$ detects fault $f_j$ under the single fault assumption ($f_j$ is the only fault in the circuit under test). From the table, it can be seen that $t_3, t_5, t_6, t_7$ are essential vectors of T corresponding to the essential faults $f_9, f_{10}, f_{11}, f_{12}$. When $t_3, t_5, t_6, t_7$ are removed from T and all the faults they cover are removed from the original cover F, we have the situation depicted in FIG. 3. None of the faults ($f_1$ and $f_3$) remaining in F is essential with respect to the updated test set $T=\{t_1, t_2, t_4\}$.

When the remaining test vectors $t_1, t_2, t_4$ in T are checked (in that order) for their coverage of the remaining faults, $t_4$ is found to be redundant. When the identified redundant test vector $t_4$ is discarded, $f_3$ becomes an essential fault with respect to $T=\{t_1, t_2\}$ and $t_2$ becomes the corresponding essential vector. Selecting the essential vector $t_2$ from T and removing the faults detectable by it from the set $F=\{f_1, f_3\}$, empties F. So, the remaining test vector $t_1$ in T is also discarded. Thus the compacted test set, $CT=\{t_2, t_3, t_5, t_6, t_7\}$, is now without the vectors $t_1, t_4$.

In general, This method is to effect static compaction by a few repetitions of the selection of essential vectors and discarding of identified redundant vectors. This benefit of the compaction method is shown as follows.

Lemma 1: With reference to a given set of faults in a circuit C, any test set T without essential vectors has at least one test vector t that is redundant with respect to the set $T=T\backslash\{t\}$.

Proof: Suppose that at a cycle of the repetition, the test vectors $\tau_1, \tau_2, \ldots, \tau_i, \ldots, \tau_N$ are remaining. Assume there are no essential vectors in the remaining test vectors. Thus, any fault in the cover of a set of the remaining test vectors that is detectable by the vector $\tau_j$ is also detectable by another vector $\tau_k$ (i.e. k≠j) in the same set. Thus, at least, $\tau_j$ is redundant. Q.E.D.

Lemma 1 shows that in the process of repeated application of essential vector selection and the discarding of redundant vectors, a deadlock situation where there are neither essential vectors nor redundant vectors, does not occur.

Processing the remaining data as explained earlier (with FIG. 3) may lead to a non-minimal solution. For example, if $t_2$ happened to detect only $f_3$ and $t_4$ happened to detect $f_1$ in addition to $f_3$, then $t_1$ and $t_2$ would be selected leaving $t_4$ as redundant. In this case, the process will eliminate only one vector, $t_4$. In view of this, the following processing is performed to ensure a minimal solution to the static compaction problem.

First, a subset of test stimuli that optimally covers a given set of faults is identified. Secondly, one or more test stimuli other than the identified test stimuli are eliminated as the redundant test stimuli.

After the selection of every set of essential vectors, the first of the remaining n test vectors to be retained is the one that detects the greatest number of the remaining faults in set F. The second vector to be retained is the one that detects the greatest number of the faults in the set $S=F\backslash C_1$; where $C_1$ is the set of faults in F that are detectable by the first retained vector. In general, the i-th vector to be retained is the one that detects the greatest number of the faults in the set $S=F\backslash\Gamma$; where $\Gamma=\cup_{j=1}^{i-1} C_j$ and $C_j$ is the set of faults in F that are detectable by the j-th retained vector. This processing continues until $\Gamma=F$ after the k-th retained vector. At this point the residual (n–k) vectors are discarded and another cycle begins with the selection of the next hierarchy of essential vectors.

A direct application of the minimum covering algorithm involves a matrix for the cover table of test vectors. For practical circuits, this will require a large amount of memory which may not be available. Thus, this situation will impose a limitation on the applicability of the method to practical circuits. To go around this problem, the two-dimensional data space of a matrix is reduced to the more manageable one-dimensional data space. This is achieved as follows.

First, a counter is associated with each fault. Each counter indicates the number of test vectors by which the corresponding fault is detectable. Simulation of the target circuit is performed with the original test set. For each test vector, detectable faults are traced backward from the primary outputs. Any time a fault is traced, the counter associated with the fault is incremented. Also, the test vectors are mapped onto the faults.

In this simulation, a method shown in the following documents can be applied. This method facilitates the extraction of information on faults covered by the original test set without conducting repetitive fault simulation.

(7) K. O. Boateng, H. Takahashi and Y. Takamatsu, "Diagnosing delay faults in combinational circuits under the ambiguous delay model," IEICE Transaction on Information and Systems, Vol.E82-D, No.12, pp.1563-1571, December 1999.

(8) K. O. Boateng, H. Takahashi and Y. Takamatsu, "Multiple gate delay fault diagnosis using test-pairs for marginal delays," IEICE Transaction on Information and Systems, Vol.E81-D, No.7, pp.706-715, July 1998.

(9) N. Yanagida, H. Takahashi and Y. Takamatsu, "Multiple fault diagnosis by sensitizing input pairs," IEEE Design & Test of Computers, Vol.12, No.3, pp.44-52, September 1995.

All faults with counter=1 are essential faults and the respective test vectors that mapped onto them constitute the essential vectors. Any time an essential vector is selected, all the faults it detects are removed from the fault set. Also, any time a redundant test vector is identified, the counter of each fault in the updated fault set onto which it is mapped, is decremented.

Figure 4:
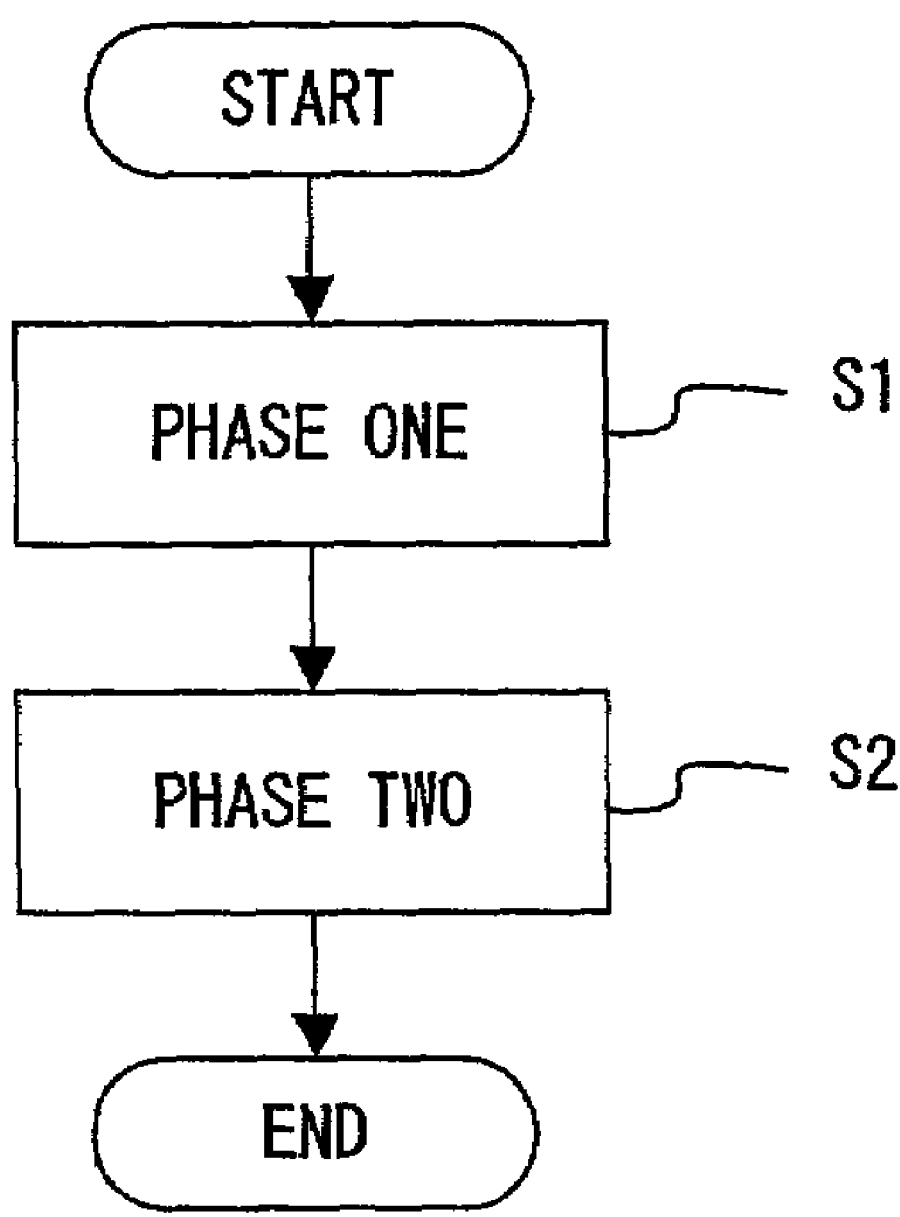
FIG. 4 shows a flowchart of a compaction process.

FIG. 4 shows a process of the static compaction performed by the compaction apparatus. This process has two phases. In the first phase, simulations are performed and fault tracing is carried out to establish the vector-to-fault mapping (step S1). During fault tracing, fault-counter incrementing is performed. In the second phase, the process of essential vector selection and the process of discarding redundant vectors are performed (step S2).

FIG. 5 shows a process performed in the first phase. First, the compaction apparatus performs simulations to establish the vector-to-fault mapping, and increments counters as the faults to which they are associated are traced (step S11). Next, the compaction apparatus puts all the test vectors in the set T_set, and all the traced faults in the set F_set (step S12). Then, the compaction apparatus sets each of the sets CT_set, T1_set, and F1_set to the empty set { } (step S13). The process in step S11 is not necessary when the similar result is obtained from test generation.

Figure 6:
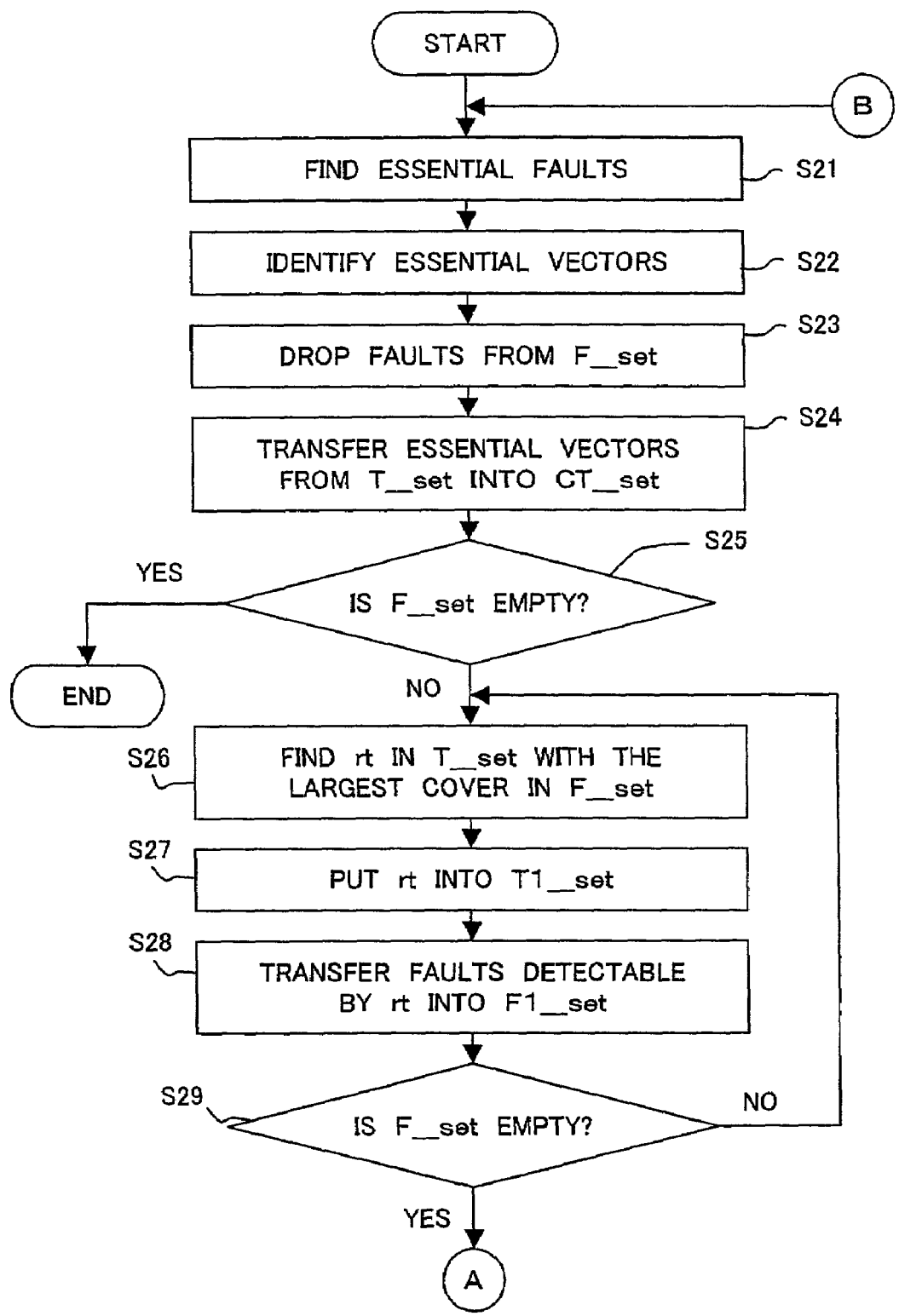
FIG. 6 shows the first part of a flowchart of a process in the second phase.
Figure 7:
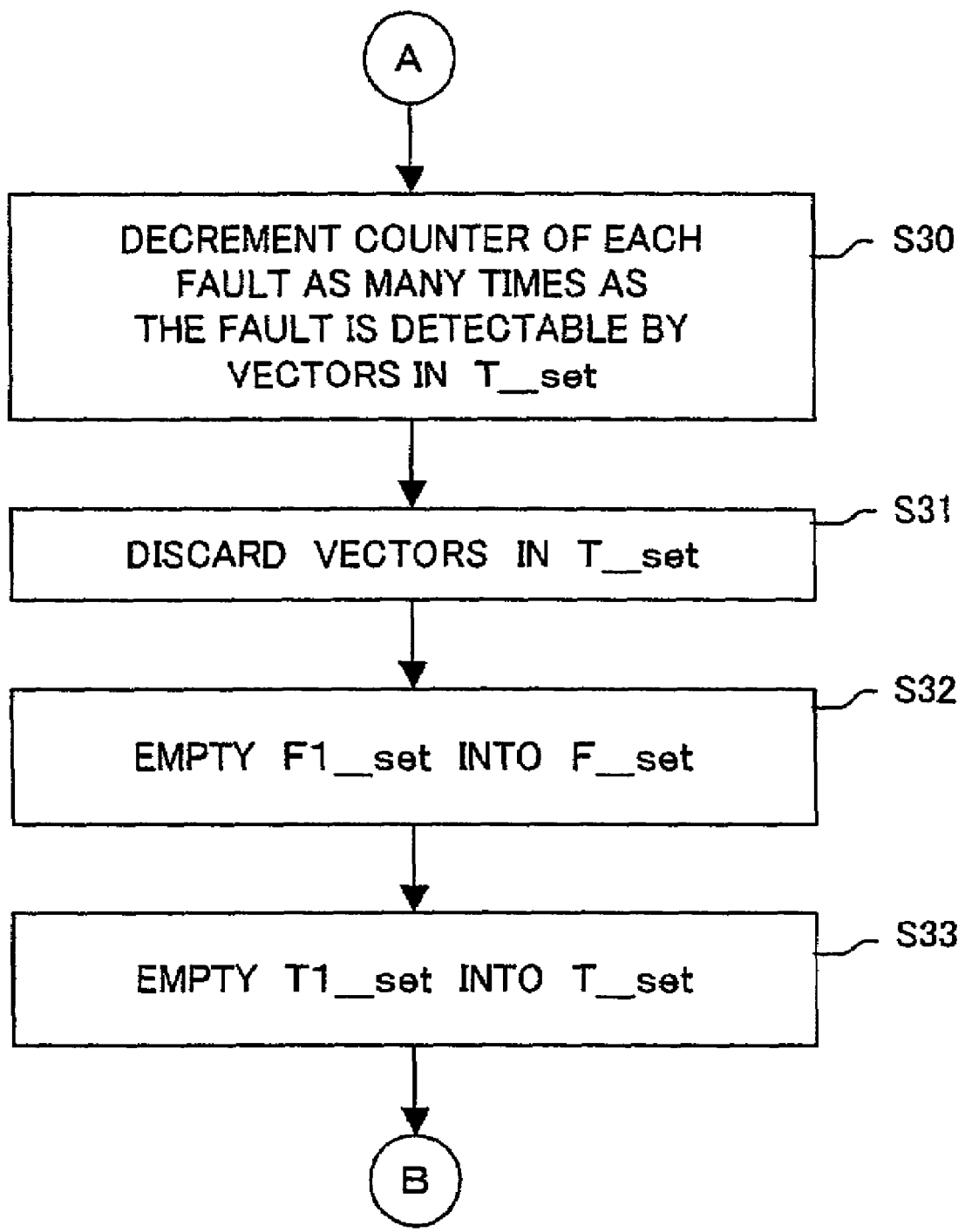
FIG. 7 shows the second part of the flowchart of the process in the second phase.

FIGS. 6 and 7 show a process performed in the second phase. First, the compaction apparatus finds all current essential faults (step S21 in FIG. 6) and identifies their corresponding essential vectors (step S22). Next, the compaction apparatus drops all faults detectable by the identified essential vectors from F_set (step S23) and transfers the identified essential vectors from T_set into CT_set (step S24). Then, whether F_set is empty is checked (step S25).

If F_set is empty, the compaction apparatus discards any test vectors in T_set as redundant test vectors and terminates the process. If F_set is not empty, the compaction apparatus finds in T_set the test vector, rt, with the largest cover of faults in F_set (step S26), puts rt into T1_set (step S27), and transfers all faults in F_set that are detectable (covered) by rt into F1_set (step S28). Then, whether F_set is empty is checked again (step S29).

If F_set is not empty, the processes in and after step S26 are repeated. If F_set is empty, then, for each test vector $\tau$ still remaining in T_set, the compaction apparatus decrements the counter of any fault in F1_set that is detectable by $\tau$ (step S30 in FIG. 7). Next, the apparatus discards all test vectors remaining in T_set as redundant test vectors (step S31). Then, the compaction apparatus empties F1_set into F_set (step S32) and T1_set into T_set (step S33) and repeats the processes in and after step S21 in FIG. 6. According to such a compaction process, the compacted test set is stored in CT_set at the end of compaction.

Figure 8:
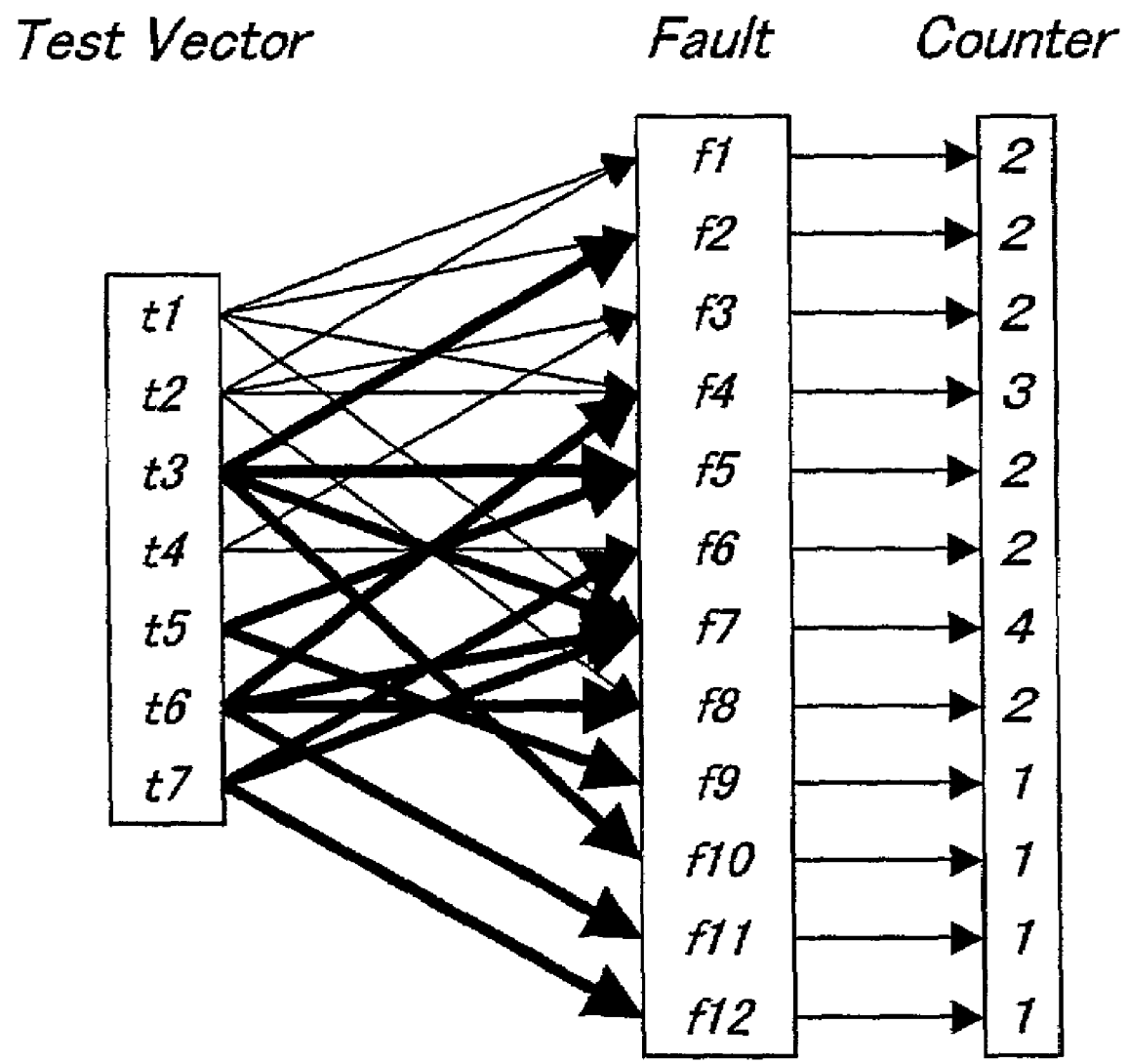
FIG. 8 shows the initial vector-to-fault mapping.

After the first phase process, the data of the cover table shown in FIG. 2 are organized as shown in FIG. 8. In this data structure, T_set={$t_1, t_2, t_3, t_4, t_5, t_6, t_7$}, F_set={$f_1, f_2, f_3, f_4, \ldots, f_{11}, f_{12}$}, and arrows from each test vector in T_set to faults in F_set indicate that it covers the faults. Counter=1 is the criterion for the identification of essential faults and hence essential vectors and the arrows from essential vectors are depicted in bold lines.

For example, T_set, F_set and counters are stored in one-dimensional arrays, respectively and an arrow from a test vector to a fault is represented by pointing information such as a corresponding index of the array of F_set. Thus, the test vector is associated with the fault.

Figure 9:
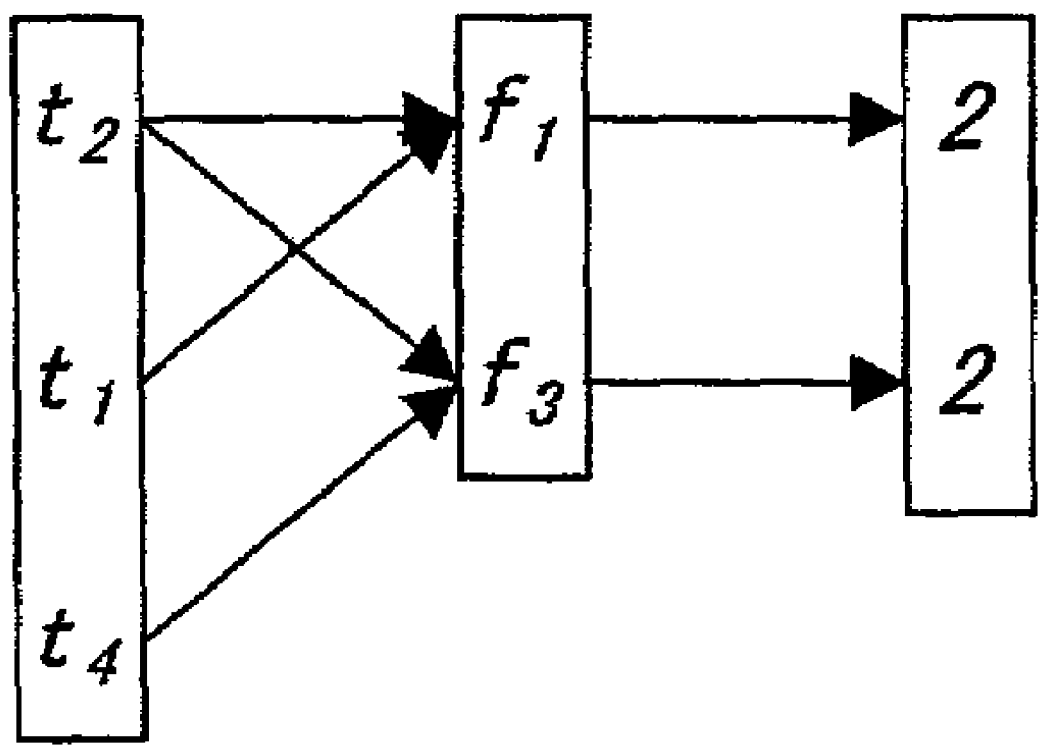
FIG. 9 shows an updated vector-to-fault mapping.
Figure 10:
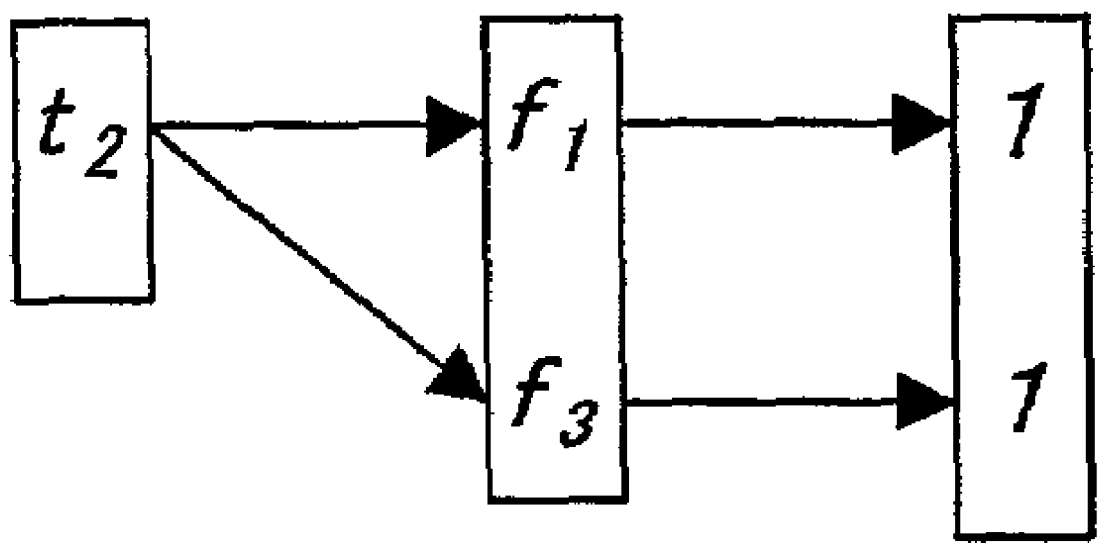
FIG. 10 shows a further-updated vector-to-fault mapping.

After selecting current essential vectors, dropping all the faults they cover, and updating T_set and F_set, the new updated mapping is shown in FIG. 9. The remaining test vectors may be checked in the order $t_1 \rightarrow t_2 \rightarrow t_4$ to investigate how many of the remaining faults are detectable by each vector. This will lead to the identification of $t_2$ as the test vector with the largest cover. Transferring $t_2$ into T1_set and $f_1$ and $f_3$ into F1_set empties F_set. Therefore, $t_1$ and $t_4$ are discarded and the counters of $f_1$ and $f_3$ (the faults detectable by $t_1$ and $t_4$) are decremented. The updated T_set and F_set are reordered as shown in FIG. 10 and $t_2$ is left as an essential vector to be selected. Selecting $t_2$ and dropping the faults in F_set that are detectable by $t_2$, leads to the emptying of F_set. Hence the compacted test set results in CT_set={$t_2$, $t_3$, $t_5$, $t_6$, $t_7$}.

Figure 11:
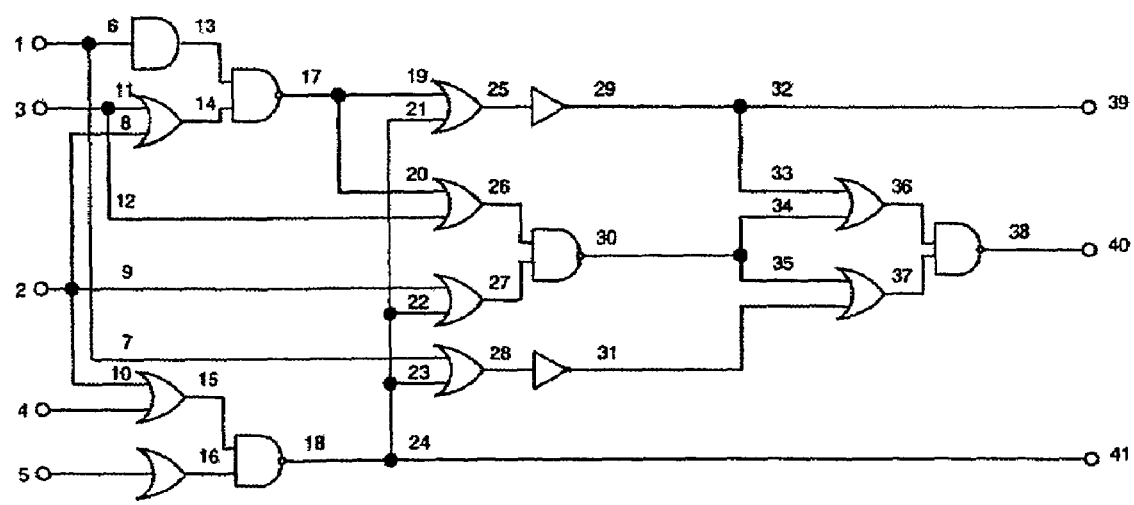
FIG. 11 shows an example of a digital circuit.

FIG. 11 shows a concrete example of the circuit under test. A test set for the circuit is shown in FIG. 12. Patterns of 16 test vectors are expressed in 3-valued logic, where "2" represents the unknown logic. In what follows, $F_{ti}$ will be used to symbolize the set of faults detected by the test vector $t_i$ (i=1, 2, . . . , 16) and a stuck-at-α (α=0, 1) fault at line L (L=1, 2, 3, . . . , 36, 37, 38) is represented as L/α.

$F_{t1}$={1/1; 2/0; 5/0; 6/1; 9/0; 13/1; 15/0; 16/0; 17/0; 18/1; 19/0; 24/1; 25/0; 26/0; 27/0; 29/1; 30/1; 32/1; 33/1; 34/1; 36/1; 38/0}

$F_{t2}$={1/0; 5/0; 6/0; 13/0; 14/0; 15/0; 16/0; 17/1; 18/1; 19/1; 21/1; 24/1; 25/1; 29/0; 32/0}

$F_{t3}$={2/1; 4/1; 10/1; 15/1; 18/0; 24/0; 25/0; 29/1; 32/1}

$F_{t4}$={2/0; 5/0; 10/0; 15/0; 16/0; 18/1; 24/1}

$F_{t5}$={2/1; 3/1; 4/0; 5/0; 8/1; 9/1; 11/1; 14/1; 15/0; 16/0; 17/0; 18/1; 19/0; 22/1; 24/1; 25/0; 27/1; 29/1; 30/0; 32/0; 34/0; 35/0; 36/0; 37/0; 38/1}

$F_{t6}$={1/0; 2/1; 3/0; 4/0; 5/0; 6/0; 9/1; 11/0; 13/0; 14/0; 15/0; 16/0; 17/1; 18/1; 19/1; 21/1; 22/0; 24/1; 25/1; 27/1; 29/0; 30/0; 32/0; 35/0; 36/0; 37/0; 38/1}

$F_{t7}$={4/0; 5/0; 15/0; 16/0; 18/1; 24/1; 36/1; 37/1; 38/1}

$F_{t8}$={5/1; 16/1; 18/0; 24/0; 25/0; 29/1; 32/1}

$F_{t9}$={5/0; 15/0; 16/0; 18/1; 24/1}

$F_{t10}$={5/1; 16/1; 18/0; 24/0; 25/0; 29/1; 32/1; 38/0}

$F_{t11}$={1/0; 2/0; 3/1; 5/0; 6/0; 8/0; 12/1; 13/0; 14/0; 15/0; 16/0; 17/1; 18/1; 19/1; 20/1; 21/1; 24/1; 25/1; 26/1; 29/0; 30/0; 32/0; 35/0; 36/0; 37/0; 38/1}

$F_{t12}$={1/1; 2/1; 4/0; 5/0; 6/1; 9/1; 13/1; 15/0; 16/0; 17/0; 18/1; 19/0; 22/1; 24/1; 25/0; 27/0; 29/1; 30/0; 32/0; 34/0; 36/0; 37/0; 38/1}

$F_{t13}$={1/1; 2/0; 5/0; 6/1; 9/0; 13/1; 15/0; 16/0; 17/0; 18/1; 19/0; 24/1; 25/0; 26/0; 27/0; 29/1; 30/1; 32/1; 33/1; 34/1; 36/1; 38/0}

$F_{t14}$={1/0; 2/0; 3/1; 5/0; 6/0; 8/0; 12/1; 13/0; 14/0; 15/0; 16/0; 17/1; 18/1; 19/1; 20/1; 21/1; 24/1; 25/1; 26/1; 29/0; 30/0; 32/0; 35/0; 36/0; 37/0; 38/1}

$F_{t15}$={1/0; 2/0; 3/0; 5/0; 6/0; 7/0; 9/0; 12/0; 13/0; 14/0; 15/0; 16/0; 17/1; 18/1; 19/1; 21/1; 24/1; 25/1; 26/1; 27/0; 28/0; 29/0; 30/1; 31/1; 32/0; 35/1; 37/1; 38/0}

$F_{t16}$={5/1; 16/1; 18/0; 24/0; 25/0; 29/1; 32/1; 38/0}

At the initial stage of the second phase shown in FIG. 6, $t_3$, $t_4$, $t_5$, $t_6$, $t_5$ are identified as essential vectors. After selecting the essential vectors and dropping all the faults they detect, the remaining data is as shown in FIG. 13. F_set={1/1; 5/1; 6/1; 8/0; 12/1; 13/1; 16/1; 20/1; 26/1; 33/1; 34/1; 36/1} at the beginning of the redundant vector elimination process, and the vectors $t_1$, $t_2$, $t_7$, $t_8$, $t_9$, $t_{10}$, $t_{11}$, $t_{12}$, $t_{13}$, $t_{14}$, $t_{16}$ detect 6, 0, 0, 2, 0, 2, 4, 3, 6, 4, 2 of the remaining faults, respectively. $t_1$ is selected first as $rt_1$ with $C_1$={1/1; 6/1; 13/1; 33/1; 34/1; 36/1}. F_set\$C_1$={5/1; 8/0; 12/1; 16/1; 20/1; 26/1}, and vectors $t_2$, $t_7$, $t_8$, $t_9$, $t_{10}$, $t_{11}$, $t_{12}$, $t_{13}$, $t_{14}$, $t_{16}$ detect 0, 0, 2, 0, 2, 4, 0, 0, 4, 2 of the remaining faults, respectively. Next, $t_{11}$ is selected as $rt_2$ with $C_2$={8/0; 12/1; 20/1; 26/1}. Now, F_set\($C_1 \cup C_2$)={5/1; 16/1} and vectors $t_2$, $t_7$, $t_8$, $t_9$, $t_{10}$, $t_{12}$, $t_{13}$, $t_{14}$, $t_{16}$ detect 0, 0, 2, 0, 2, 0, 0, 0, 2 of the remaining faults, respectively. $t_8$ is selected as $rt_3$ with $C_3$={5/1; 16/1}. At this stage, F_set\($C_1 \cup C_2 \cup C_3$)={ }; thus $C_1 \cup C_2 \cup C_3$=F_set. Each of the residual vectors $t_2$, $t_7$, $t_9$, $t_{10}$, $t_{12}$, $t_{13}$, $t_{14}$, $t_{16}$ is discarded after decrementing the detection counters of all faults it covers and current process of redundant vector elimination ends.

All the faults in F_set={1/1; 5/1; 6/1; 8/0; 12/1; 13/1; 16/1; 20/1; 26/1; 33/1; 34/1; 36/1} have become essential, and hence $rt_1=t_1$, $rt_2=t_{11}$ and $rt_3=t_8$ constitute the second hierarchy of essential vectors. Adding these three vectors to the earlier set of essential vectors, yields the set {$t_1$, $t_3$, $t_4$, $t_5$, $t_6$, $t_8$, $t_{11}$, $t_{15}$} of eight vectors that covers all the faults that are detectable by the original test set of 16 vectors. Thus, the compaction process halves the test set while ensuring that fault coverage does not change.

Even though the examples described above use the stuck-at fault model, the compaction process of the present invention can be applied to other fault models. The size of a test stimulus for a combinational circuit is dependent on the test model. In the following the stuck-at and delay fault models are used for illustration.

Figure 14:
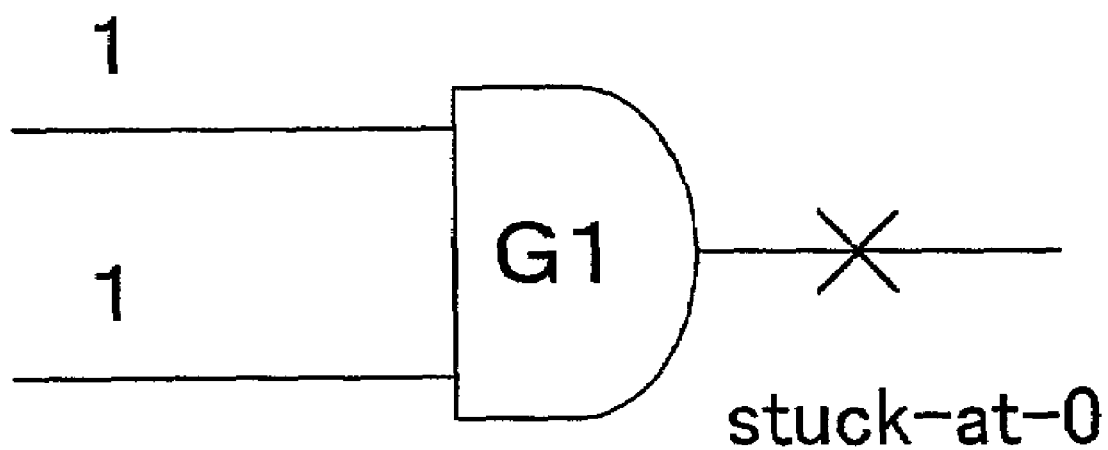
FIG. 14 shows a stuck-at fault model.

FIG. 14 illustrates the stuck-at fault model. A stuck-at-0 fault at the output of AND gate G1 will cause the output value to be 0 irrespective of the input-pattern. To detect the fault, a single input-pattern "1, 1" that attempts to set the output to logic 1 is applied. If the expected logic 1 is observed at the output the fault is non-existent. On the other hand, the existence of the fault is confirmed if the output logic value is 0. Thus, to test a stuck-at fault, a test stimulus comprising one input-pattern is necessary.

Figure 15:
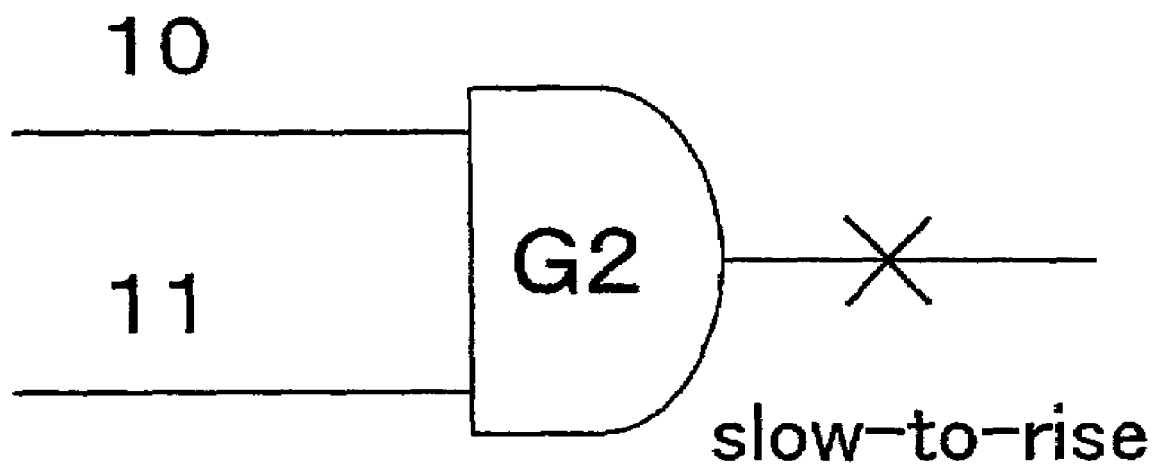
FIG. 15 shows a delay fault model.

FIG. 15 illustrates the delay fault model. A delay fault is the situation where the effect of changes occurring at the inputs of a gate takes a longer time than the expected to propagate to the output. Under the transition delay fault model, delay faults are expressed in terms of transition and timing. Two faults, slow-to-fall and slow-to-rise, are associated with the gate output. To detect the slow-to-rise fault at the output of AND gate G2, first, the output is set to the 'low' logic (logic 0) by the first input-pattern, in this case "0, 1". Next an attempt is made to change the output logic to 'high' (to cause a rise from 0 to 1) at some time (δ units) after the application of the second input-pattern "1, 1". If the output logic turns 1 (δ units after the application of the second input-pattern), the fault is non-existent. Otherwise the delay fault will be detected. Here, to test the single fault, a test stimulus consisting of a pair of input-patterns is necessary.

To apply the compaction method to a sequential circuit, a sequence of initializing, sensitizing and propagation subsequences are considered as a single test stimulus.

By the way, the compaction apparatus of the present embodiments is configured using an information processing apparatus (computer) as shown in FIG. 16. The information processing apparatus shown in FIG. 16 comprises a CPU (central processing unit) 51, memory 52, an input device 53, an output device 54, and external storage device 55, a medium driver device 56, a network connection device 57, which are interconnected through a bus 58.

The memory 52 includes ROM (read only memory), RAM (random access memory), etc., and stores a program and data used in the compaction process. The CPU 51 performs a necessary process by executing a program using the memory 52.

The input device 53 can be, for example, a key board, a pointing device, a touch panel, etc. and is used in inputting an instruction from a user and information. The output device 54 can be, for example, a display, a printer, a speaker, etc., and is used in outputting an inquiry to the user and a process result.

The external storage device 55 can be, for example, a magnetic disk device, an optical disk device, a magneto-optical disk device, a tape device, etc. The information processing apparatus stores the program and data in the external storage device 55, and loads them as necessary to the memory 52 to use them.

The medium driver device 56 drives a portable storage medium 59, and accesses the stored contents. The portable storage medium 59 can be any computer-readable storage medium such as a memory card, a floppy disk, CD-ROM (compact disk read only memory), an optical disk, a magneto-optical disk, etc. The user stores the program and data in the portable storage medium 59, and loads them as necessary to the memory 52 to use them.

The network connection device 57 is connected to a communications network such as a LAN (local area network), etc., and converts data for the communications. The information processing apparatus receives the program and data as necessary from another device through the network connection device 57, and loads them to the memory 52 to use them.

Figure 17:
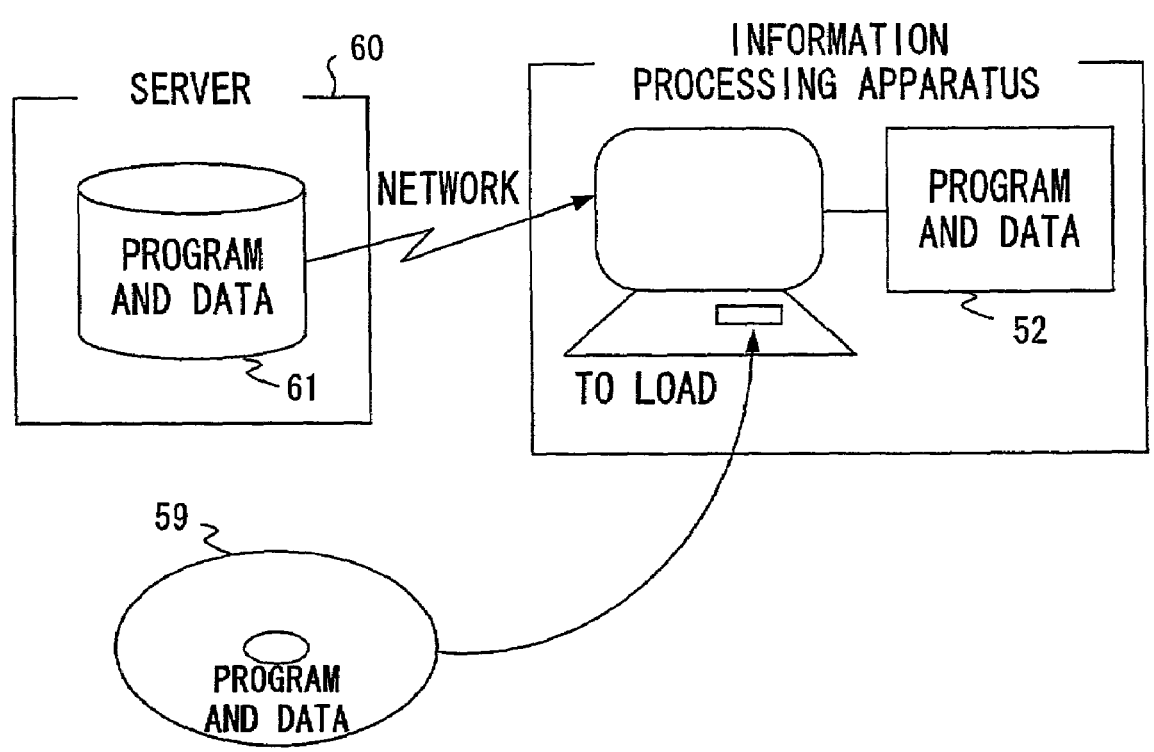
FIG. 17 shows recording media.

FIG. 17 shows computer-readable storage media capable of providing the information processing apparatus with a program and data. The program and data stored in the portable storage medium 59 or a database 61 of a server 60 are loaded to the memory 52. At this time, the server 60 generates a propagation signal for propagating the program and data, and transmits the signal to the information processing apparatus through an arbitrary transmission medium in the network. Then, the CPU 51 executes the program using the data, and performs a necessary process.

According to the present invention, by configuring static compaction of test stimuli as a minimum covering problem, a test-stimuli compaction independent of the test generation algorithm is realized. This compaction is effective for test stimuli generated by any generation algorithm for a general digital circuit.

What is claimed is:

1. An apparatus performing compaction of a set of test stimuli for a digital circuit, comprising:
   a simulation device performing a simulation on the digital circuit with the set of test stimuli to trace faults which the set of test stimuli cover;
   a selection device selecting essential test stimuli from among subsets of the set of test stimuli after mapping between the test stimuli and the faults has been established by the simulation, an essential test stimulus being a test stimulus that detects at least one fault, which is detectable by no other test stimulus in one of the subsets of test stimuli;
   an elimination device eliminating redundant test stimuli from among subsets of test stimuli after selection of essential test stimuli from each subset, a redundant test stimulus being a test stimulus that detects a fault, which is detectable by another test stimulus in each subset after the selection of the essential test stimuli; and
   an output device outputting a compacted set comprising the selected essential test stimuli.

2. The apparatus according to claim 1, wherein said output device outputs a minimum-sized subset of the set of test stimuli, which covers faults detectable by the set of test stimuli without modifying test stimuli in the minimum-sized subset, as the compacted set.

3. The apparatus according to claim 1, wherein said selection device hierarchically repeats the selection of essential test stimuli from among subsets of remaining test stimuli after elimination of redundant test stimuli from the subsets, and said output device outputs the compacted set comprising the selected essential test stimuli.

4. The apparatus according to claim 1, wherein said elimination device identifies a subset of test stimuli that optimally covers a given set of faults and eliminates one or more test stimuli other than the identified test stimuli as the redundant test stimuli.

5. The apparatus according to claim 1, further comprising
   a storage device storing information of the set of test stimuli, information of faults which the set of test stimuli cover, and pointing information associating each test stimulus with the faults detectable by a corresponding test stimulus,
   wherein said selection device and elimination device perform selection and elimination, respectively by referring to the information stored in said storage device.

6. The apparatus according to claim 5,
   wherein said storage device stores counter information associated with each fault and indicating the number of test stimuli by which a corresponding fault is detectable, said simulation device increments the counter information when the corresponding fault is traced during the simulation, and said selection device selects a test stimulus which covers a fault with counter information of one as an essential test stimulus.

7. The apparatus according to claim 1, wherein the apparatus performs compaction of the set of test stimuli by which faults of a stuck-at fault model are detectable.

8. The apparatus according to claim 1, wherein the apparatus performs compaction of the set of test stimuli by which faults of a delay fault model are detectable.

9. The apparatus according to claim 1, wherein the apparatus performs compaction of the set of test stimuli by regarding a sequence of initializing, sensitizing and propagation subsequences as a single test stimulus.

10. A computer readable recording medium storing a program for a computer that performs compaction of a set of test stimuli for a digital circuit, the program causes the computer to perform:
   performing a simulation on the digital circuit with the set of test stimuli to trace faults which the set of test stimuli cover;
   selecting essential test stimuli from among subsets of the set of test stimuli after mapping between the test stimuli and the faults has been established by the simulation, an essential test stimulus being a test stimulus that detects at least one fault, which is detectable by no other test stimulus in one of the subsets of test stimuli;
   eliminating redundant test stimuli from among subsets of test stimuli after selection of essential test stimuli from each subset, a redundant test stimulus being a test stimulus that detects a fault, which is detectable by another test stimulus in each subset after the selection of the essential test stimuli; and
   outputting a compacted set comprising the selected essential test stimuli.

11. A propagation signal propagating a program to a computer that performs compaction of a set of test stimuli for a digital circuit, the program causes the computer to perform:
- performing a simulation on the digital circuit with the set of test stimuli to trace faults which the set of test stimuli cover;
- selecting essential test stimuli from among subsets of the set of test stimuli after mapping between the test stimuli and the faults has been established by the simulation, an essential test stimulus being a test stimulus that detects at least one fault, which is detectable by no other test stimulus in one of the subsets of test stimuli;
- eliminating redundant test stimuli from among subsets of test stimuli after selection of essential test stimuli from each subset, a redundant test stimulus being a test stimulus that detects a fault, which is detectable by another test stimulus in each subset after the selection of the essential test stimuli; and
- outputting a compacted set comprising the selected essential test stimuli.

12. A method for compaction of a set of test stimuli for a digital circuit, comprising:
- performing a simulation on the digital circuit with the set of test stimuli to trace faults which the set of test stimuli cover;
- selecting essential test stimuli from among subsets of the set of test stimuli after mapping between the test stimuli and the faults has been established by the simulation, an essential test stimulus being a test stimulus that detects at least one fault, which is detectable by no other test stimulus in one of the subsets of test stimuli;
- eliminating redundant test stimuli from among subsets of test stimuli after selection of essential test stimuli from each subset, a redundant test stimulus being a test stimulus that detects a fault, which is detectable by another test stimulus in each subset after the selection of the essential test stimuli; and
- outputting a compacted set comprising the selected essential test stimuli.

13. An apparatus performing compaction of a set of test stimuli for a digital circuit, comprising:
- simulation means for performing a simulation on the digital circuit with the set of test stimuli to trace faults which the set of test stimuli cover;
- selection means for selecting essential test stimuli from among subsets of the set of test stimuli after mapping between the test stimuli and the faults has been established by the simulation, an essential test stimulus being a test stimulus that detects at least one fault, which is detectable by no other test stimulus in one of the subsets of test stimuli;
- elimination means for eliminating redundant test stimuli from among subsets of test stimuli after selection of essential test stimuli from each subset, a redundant test stimulus being a test stimulus that detects a fault, which is detectable by another test stimulus in each subset after the selection of the essential test stimuli; and
- output means for outputting a compacted set comprising the selected essential test stimuli.

14. A method for tracing faults on a circuit, comprising:
selecting essential test stimuli;
eliminating redundant test stimuli after selection of said essential test stimuli; and outputting the selected essential test stimuli.

* * * * *

UNITED STATES PATENT AND TRADEMARK OFFICE
CERTIFICATE OF CORRECTION

PATENT NO. : 7,260,793 B2
APPLICATION NO. : 09/985768
DATED : August 21, 2007
INVENTOR(S) : Kwame Osei Boateng It is certified that error appears in the above-identified patent and that said Letters Patent is hereby corrected as shown below:

Title Page, Column 2 (Other Publications), Line 7, change "Circiuts" to --Circuits--.

Title Page, Column 2 (Other Publications), Line 10, change "Circiuts" to --Circuits--.

Signed and Sealed this

Twenty-fifth Day of December, 2007

JON W. DUDAS
*Director of the United States Patent and Trademark Office*